(12) United States Patent
Kwan et al.

(10) Patent No.: US 8,887,012 B2
(45) Date of Patent: Nov. 11, 2014

(54) METHOD AND APPARATUS FOR SAVING AND RESTORING SOFT REPAIR DATA

(75) Inventors: Bill K. Kwan, Austin, TX (US);
Atchyuth K. Gorti, Austin, TX (US);
Norm Hack, Pflugerville, TX (US);
David Kaplan, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 725 days.

(21) Appl. No.: 12/862,129

(22) Filed: Aug. 24, 2010

(65) Prior Publication Data

US 2012/0054549 A1 Mar. 1, 2012

(51) Int. Cl.
*G06F 11/00* (2006.01)
*G11C 29/44* (2006.01)
*G11C 29/00* (2006.01)
*G11C 29/04* (2006.01)

(52) U.S. Cl.
CPC ............ *G11C 29/74* (2013.01); *G11C 29/4401* (2013.01); *G11C 2029/0409* (2013.01); *G11C 2029/4402* (2013.01)
USPC ........................................ 714/723

(58) Field of Classification Search
USPC ......................................................... 714/723
See application file for complete search history.

(56) References Cited

U.S. PATENT DOCUMENTS

| | | | |
|---|---|---|---|
| 5,890,219 A * | 3/1999 | Scaringella et al. ........... 711/162 |
| 6,389,462 B1 * | 5/2002 | Cohen et al. ................... 709/218 |
| 7,603,582 B2 * | 10/2009 | Barlow et al. ................. 714/6.32 |
| 7,607,038 B2 * | 10/2009 | Barlow et al. ................. 714/6.32 |
| 7,673,171 B2 * | 3/2010 | Barlow et al. ................. 714/6.32 |
| 7,694,174 B2 * | 4/2010 | Barlow et al. ................. 714/6.32 |
| 7,917,804 B2 * | 3/2011 | Barlow et al. ..................... 714/10 |
| 8,117,498 B1 * | 2/2012 | Wood et al. ....................... 714/30 |
| 8,181,063 B2 * | 5/2012 | Nakajima ......................... 714/11 |
| 2003/0074598 A1 * | 4/2003 | Bossen et al. ...................... 714/6 |
| 2008/0022149 A1 * | 1/2008 | Ouellette et al. ................... 714/6 |
| 2008/0072088 A1 * | 3/2008 | Allarey et al. ................. 713/324 |
| 2012/0030509 A1 * | 2/2012 | Wood et al. .................. 714/6.31 |

* cited by examiner

*Primary Examiner* — Amine Riad

(57) ABSTRACT

The present invention provides a method and apparatus for saving and restoring soft repair information. One embodiment of the method includes storing soft repair information for one or more cache arrays implemented in a processor core in a memory element outside of the processor core in response to determining that a voltage supply to the processor core is to be disconnected.

15 Claims, 5 Drawing Sheets

| 63 | 62 | 61:2 | 1:0 |
|---|---|---|---|
| MICROCODE RESTORE DONE | FUSE CONTROL LOAD DONE | RESERVED | INDEX TO SOFT REPAIR DATA REGISTER |

Figure 2A

| 63:0 |
|---|
| SOFT REPAIR DATA |

Figure 2B

| MACRO_3 | | | | MACRO_2 | | | | MACRO_1 | | | | MACRO_0 | | | |
|---|---|---|---|---|---|---|---|---|---|---|---|---|---|---|---|
| 63:62 | 61:60 | 59:54 | 53:48 | 47:46 | 45:44 | 43:38 | 37:32 | 31:30 | 29:28 | 27:22 | 21:16 | 15:14 | 13:12 | 11:6 | 5:0 |
| REP EN | REP LOAD | RC1 | RC0 | REP EN | REP LOAD | RC1 | RC0 | REP EN | REP LOAD | RC1 | RC0 | REP EN | REP LOAD | RC1 | RC0 |

METHOD AND APPARATUS FOR SAVING AND RESTORING SOFT REPAIR DATA

BACKGROUND OF THE INVENTION

1. Field of the Invention

This invention relates generally to processor-based systems, and, more particularly, to saving and restoring soft repair data in a processor-based system.

2. Description of the Related Art

Processor cores typically include cache arrays or macros for storing information that defines the current state of the processor core. The cache arrays are formed of numerous rows and columns of memory elements. Although the memory elements that make up the cache arrays are generally very reliable, they are not perfectly reliable and they can in some instances fail. Failure may be the result of defects or errors during fabrication of the cache arrays or may be the result of portions of the cache array wearing out or malfunctioning over time. A failed cache array or macro can severely impact the operation of the processor core and so processor cores often implement various techniques for recovering from cache array or macro failures. One approach is to include redundant portions of the cache arrays, such as one or more redundant rows and/or columns of memory elements that can be used in place of a failed row and/or column.

A memory built-in self test (MBIST) can be used to detect failures in the cache arrays of a processor core. For example, the MBIST can be run during a cold reset of the processor core. When the MBIST detects a failure in a portion of a cache array, such as a column of the cache array, the MBIST can repair the failed column by performing a hard repair using hardware fuses. Hard repair is typically targeted for cache failures found at the time of product testing at the manufacturer. To implement a hard repair, selected hardware fuses are blown to effect changes in the physical connections within the macros so that the failed column is operationally replaced with one of the redundant columns. For example, the MBIST can communicate with a fuse slave controller that is configured to blow the appropriate fuses to replace the failed column with one of the redundant columns. The area available in the core for hardware elements is very limited and consequently the number of fuses available within the processor core is limited to a number that is typically significantly less than the number that would be required to utilize all of the redundant columns using fuses.

The MBIST can also use soft repair techniques to repair failed cache arrays using redundant hardware. Soft repair is typically used to address failures in the field and/or with the end-user because of variations of the operating conditions like temperature. To implement a soft repair, the processor core includes a bank of registers that includes information that can be used to repair failed cache arrays. For example, when the MBIST detects an error or failure in a column of a cache array, the fuse slave controller generates information that can be used to modify the operation of the cache array so that the redundant columns are used in place of the failed column. Soft repairs do not change the physical structure of the array. This information is stored in the registers so that it can be read by the microcode that controls operation of the cache array. The registers including the soft repair information are erased when the processor core is powered down (or power gated) and so conventional processor cores run an MBIST when the core is powered up to regenerate the soft repair information. Re-creating the soft repair information by running an MBIST increases the latency of the power-up procedure.

SUMMARY OF EMBODIMENTS OF THE INVENTION

The disclosed subject matter is directed to addressing the effects of one or more of the problems set forth above. The following presents a simplified summary of the disclosed subject matter in order to provide a basic understanding of some aspects of the disclosed subject matter. This summary is not an exhaustive overview of the disclosed subject matter. It is not intended to identify key or critical elements of the disclosed subject matter or to delineate the scope of the disclosed subject matter. Its sole purpose is to present some concepts in a simplified form as a prelude to the more detailed description that is discussed later.

In one embodiment, a method is provided for saving and restoring soft repair information. One embodiment of the method includes storing soft repair information for one or more cache arrays implemented in a processor core in a memory element outside of the processor core in response to determining that a voltage supply to the processor core is to be disconnected.

In another embodiment, an apparatus is provided for saving and restoring soft repair information. One embodiment of the apparatus includes a processor core configured to store soft repair information for one or more cache arrays implemented in the processor core in a memory element outside of the processor core in response to determining that a voltage supply to the processor core is to be disconnected.

In yet another embodiment, a computer system is provided for saving and restoring soft repair information. One embodiment of a computer system includes a processor core comprising at least one cache array and a memory element implemented outside of the processor core. The processor core is configured to store soft repair information for the cache array(s) in the memory element in response to determining that a voltage supply to the processor core is to be disconnected.

BRIEF DESCRIPTION OF THE DRAWINGS

The disclosed subject matter may be understood by reference to the following description taken in conjunction with the accompanying drawings, in which like reference numerals identify like elements, and in which:

FIGS. 2A, 2B, and 2C conceptually illustrates exemplary embodiment of soft repair registers that can be implemented in the processor core;

Figure 1:
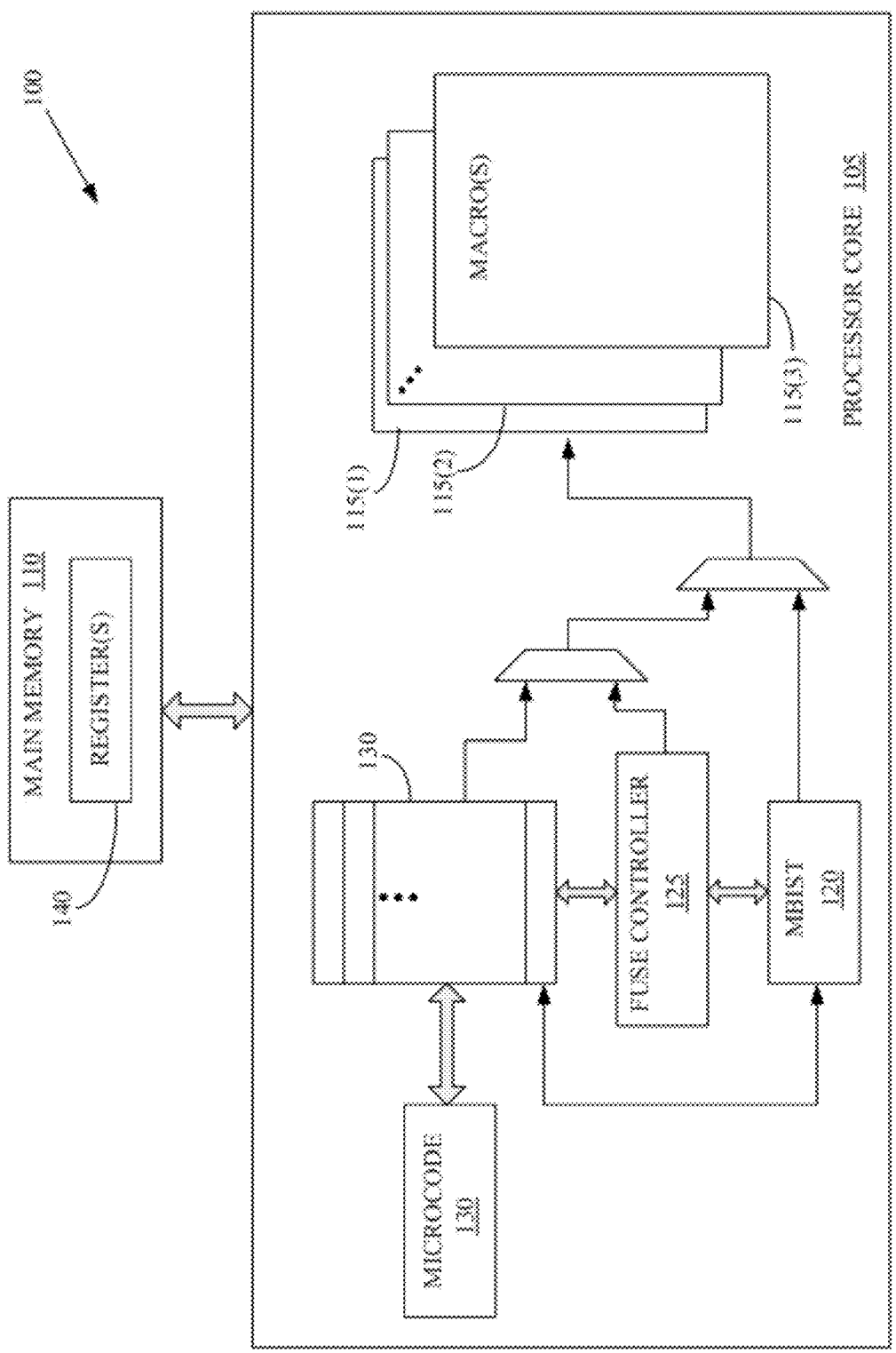
FIG. 1 conceptually illustrates one exemplary embodiment of a semiconductor device that may be formed in or on a semiconductor wafer.

While the disclosed subject matter is susceptible to various modifications and alternative forms, specific embodiments thereof have been shown by way of example in the drawings and are herein described in detail. It should be understood, however, that the description herein of specific embodiments is not intended to limit the disclosed subject matter to the particular forms disclosed, but on the contrary, the intention is to cover all modifications, equivalents, and alternatives falling within the scope of the appended claims.

DETAILED DESCRIPTION OF SPECIFIC EMBODIMENTS

Illustrative embodiments are described below. In the interest of clarity, not all features of an actual implementation are described in this specification. It will of course be appreciated that in the development of any such actual embodiment, numerous implementation-specific decisions should be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The disclosed subject matter will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the disclosed subject matter. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally speaking, the present application describes techniques for supporting power management operations in a processor core. For example, in some embodiments of a processor core significant power can be conserved by implementing a power management cycle in which the VDD voltage supply to the processor core can be disconnected for short periods of time and then restored when necessary. However, the processor core should remain able to handle interrupts within a time limit or interrupt latency during the power management cycle. In some embodiments, the interrupt latency can be on the order of 30 μs. Moreover, removing the VDD voltage supply may also erase registers that include soft repair information. The repair information can be regenerated by running a memory built-in self test (MBIST) but in many embodiments it may not be possible to run the MBIST within the time limits set by the interrupt latency. Embodiments of the processor cores described herein can therefore write the contents of the soft repair registers to off-chip memory, which defined herein as memory that retains the VDD voltage supply when the VDD voltage supply is removed from the processor core or memory that is on a different voltage supply than the soft repair registers. Consequently, the off-chip memory may or may not be on a completely different chip or substrate than the soft repair registers. The contents can be written to off-chip memory on entry to the power-down phase of the power management cycle and then restore this information to the on-chip soft repair information registers on exit from the power-down phase.

FIG. 1 conceptually illustrates one exemplary embodiment of a semiconductor device 100 that may be formed in or on a semiconductor wafer (or die). The semiconductor device 100 may formed in or on the semiconductor wafer using well known processes such as deposition, growth, photolithography, etching, planarising, polishing, annealing, and the like. In the illustrated embodiment, the device 100 includes a central processing unit (CPU) core 105 that is configured to access instructions and/or data that are stored in the main memory 110. In the illustrated embodiment, the CPU core 105 is used to execute the instructions and/or manipulate the data. The CPU 105 also implements a hierarchical (or multi-level) cache system that is used to speed access to the instructions and/or data by storing selected instructions and/or data in the caches. However, persons of ordinary skill in the art having benefit of the present disclosure should appreciate that alternative embodiments of the device 100 may implement different configurations of the processor core 105, such as configurations that use external caches.

The illustrated cache system includes several cache arrays or macros 115 associated with the different parts of the hierarchical cache system. For example, the macro 115(1) implements a level 2 (L2) cache for storing copies of instructions and/or data that are stored in the main memory 110. In the illustrated embodiment, the L2 cache macro 115(1) may be smaller than the main memory 110 and may be deployed logically and/or physically closer to the CPU core 105 (relative to the main memory 110) so that information may be exchanged between the CPU core 105 and the L2 cache 115 more rapidly and/or with less latency. The illustrated cache system also includes L1 cache macros 115(2-3) for storing copies of instructions and/or data that are stored in the main memory 110 and/or the L2 cache 115(1). Relative to the L2 cache 115(1), the L1 cache arrays 115(2-3) may be implemented using smaller and faster memory elements so that information stored in the lines of the L1 caches 115(2-3) can be retrieved quickly by the processor core 105. The L1 caches 115(2-3) may also be deployed logically and/or physically closer to the processor core 105 (relative to the main memory 110 and the L2 cache 115(1)) so that information may be exchanged between the processor core 105 and the L1 caches 115(2-3) more rapidly and/or with less latency (relative to communication with the main memory 110 and the L2 cache 115(1)).

In the illustrated embodiment, the L1 caches are separated into level 1 (L1) caches 115(2-3) for storing instructions and data, which are referred to as the L1-I cache 115(2) and the L1-D cache 115(3). Separating or partitioning the L1 caches into an L1-I cache 115(2) for storing only instructions and an L1-D cache 115(3) for storing only data may allow these caches to be deployed closer to the entities that are likely to request instructions and/or data, respectively. Consequently, this arrangement may reduce contention, wire delays, and generally decrease latency associated with instructions and data. However, persons of ordinary skill in the art should appreciate that alternative embodiments of the L1 caches may not be partitioned into separate instruction-only and data-only caches 115(2-3). Moreover, persons of ordinary skill in the art having benefit of the present disclosure should appreciate that cache arrays or macros 115 represent one exemplary embodiment of a multi-level hierarchical cache memory system. Alternative embodiments may use more, fewer, and/or different cache arrays or macros including elements such as L0 caches, L1 caches, L2 caches, L3 caches, and the like.

The illustrated embodiment of the processor core 105 includes a memory built-in self test element 120 that can be used to detect failures in the cache arrays 115 of the processor core 105. The cache arrays 115 include redundant resources such as redundant memory elements, rows, and/or columns that can be used to repair failed portions of the cache arrays 115. For example, during a cold reset of the processor core 105 the MBIST element 120 can identify errors that can be corrected by hard repairs, e.g., using fuses in the processor core 105. In the illustrated embodiment, the processor core 105 includes a fuse controller 125 that can be used to select and/or control operation of the fuses so that the appropriate fuses are blown to perform the hard repairs indicated by the MBIST element 120. Techniques for detecting errors and performing hard repairs are known in the art and in the interest of clarity only those aspects of these techniques that are relevant to the claimed subject matter will be discussed herein.

The MBIST element 120 can also detect errors that can be corrected using soft repairs. In the illustrated embodiment, the MBIST element 120 can detect errors in one or more of the macros 115 and then determine or generate information that can be used to perform a soft repair of the detected errors. This information can be stored in one or more registers 130 that are implemented in the processor core 105 (on-chip). The fuse controller 125 can access the soft repair information stored in the on-chip registers 130 and can then use this information to perform the soft repairs indicated by the MBIST element 120. Techniques for detecting errors and performing soft repairs using information stored in the registers 130 are known in the art and in the interest of clarity only those aspects of these techniques that are relevant to the claimed subject matter will be discussed herein. Although a single bank of registers 130 and a single fuse controller 125 are depicted in FIG. 1, persons of ordinary skill in the art having benefit of the present disclosure should appreciate that alternative embodiments may include additional register banks and/or fuse controllers.

Microcode 135 implemented in the processor core 105 can be configured to read information from the soft repair registers 130 and store this information in off-chip memory such as the main memory 110. The soft repair information can be communicated between the processor core 105 and the main memory 110 using well known communication pathways including buses, bridges, and/or other electrical and/or communicative interconnections. In the illustrated embodiment, the main memory 110 implements or allocates one or more banks of registers 140 for storing the soft repair information that has been written out from the soft repair registers 130. The microcode 135 can also be configured to access the soft repair information stored in the registers 140 and restore this information to the soft repair registers 130 in the processor core 105.

In the illustrated embodiment, the processor core 105 implements a power management cycle that can reduce overall power consumption of the processor core 105 by entering a power-down state under certain conditions. During the power down state, the VDD voltage supply is not provided to the processor core 105 and the VDD voltage supply to the power-gateable logic in the processor core 105 is disconnected, which may cause the registers 130 to lose their contents. The microcode may therefore read contents of the soft repair registers 130 and store the register values in an off-chip memory such as the main memory 110 upon entry to the power-down state prior to erasure of the contents of the registers 130. The main memory 110 does not lose the VDD power supply during the power-down state and therefore the registers 140 are not affected by entry into the power-down state and retain the stored soft repair information. Upon exit from the power-down state, the microcode 135 can read the stored soft repair information back from the main memory 110 and write it into the registers 130. Once the microcode 130 finishes restoring the soft repair information into the register structure 130, it can trigger redundancy repair logic to honor this soft repair data and apply the indicated soft repairs to all the repairable cache arrays 115.

FIGS. 2A, 2B, and 2C conceptually illustrate exemplary embodiments of soft repair registers 200, 205, 210 that can be implemented in the processor core. As discussed herein, the contents of the soft repair registers 200, 205, 210 can be read by microcode in the soft processor core and written out to corresponding registers in off-chip memory. The microcode can also read the soft repair information stored off-chip and write it back into the soft repair registers 200, 205, 210. Persons of ordinary skill in the art having benefit of the present disclosure should appreciate that the particular structure of the registers 200, 205, 210 is intended to be illustrative and that alternative embodiments may use other structures to store the soft repair information.

FIG. 2A conceptually illustrates one exemplary embodiment of a soft repair index register 200. In the illustrated embodiment, the two lowest significant bits (1:0) in the register are used to provide an index to a register that includes the soft repair data, such as the soft repair register 205 shown in FIG. 2B. The bits (61:2) in the exemplary embodiment of the soft repair index register 200 are reserved. The bit (62) in the exemplary embodiment of the soft repair index register 200 is used to indicate whether the fuse control loading has been performed by the fuse controller. The value of the bit (62) can therefore be polled by the microcode and/or the fuse controller to determine whether the fuse controller has performed the fuse control loading associated with hard repairs of the macros. The value of the bit (62) can also be modified by the microcode and/or the fuse controller. For example, the fuse controller can write a value of "1" to this bit indicate that it has completed performing the fuse control loading. The value of the bit (63) indicates whether the microcode restore operation has been completed. The microcode can therefore set the value of the bit (63) to a value of "1" when the soft repair data has been restored to the on-chip registers from the off-chip memory.

FIG. 2B conceptually illustrates one exemplary embodiment of a soft repair data register 205. In the illustrated embodiment, the bits (63:0) are used to store soft repair data that points to the soft repair information that can be generated during a cold reset by performing an MBIST and stored in a soft repair information register such as the soft repair information register 210 shown in FIG. 2C. The bits (63:0) may also be used to store soft repair data that points to the soft repair information the data that is restored from off-chip memory by the microcode following a power management cycle. The microcode can read/write the soft repair data into/out of the register 205 so that it can be stored in the off-chip memory upon entry to a power-down state of the power management cycle and retrieved from the off-chip memory upon exit from the power-down state.

FIG. 2C conceptually illustrates one exemplary embodiment of a soft repair information register 210. In the illustrated embodiment, the soft repair information register 210 includes repair information that is organized as RepEn (repair enable that allow/enables the macro to do redundancy repair), RepLoad (repair load, when redundancy repair is allowed, this specifies when the repair data is valid) and RepCol (repair column, the data specifying which column in the macro is to be repaired/replaced using the spare repair column). However, persons of ordinary skill in the art having benefit of the present disclosure should appreciate that the structure of the soft repair information register 210 depicted in FIG. 2C is intended to be illustrative. Alternative embodiments of the soft repair information register 210 may store the same or different information and may organize this information in the same or different ways.

The information stored in the registers 200, 205, 210 may be used to perform soft repairs following exit from the power management cycle that causes voltage to be disconnected from gates within the processor core. In one embodiment, macros in the processor core may be accessible from four Special Register Bus (SRB) Stops: ID, IF, DC and BU. Each SRB stop in a block in a functional block that allows data to be pushed and/or pulled from the SRB. A fuse controller or fuse slave controller may be present at each of these SRB Stops. The fuse slave controller may contain a bank of soft repair data registers of different sizes depending on the number of macros associated with its corresponding SRB Stop. These banks can contain soft repair information that may be organized as RepEn (repair enable that allow/enables the macro to do redundancy repair), RepLoad (repair load, when redundancy repair is allowed, this specifies when the repair data is valid) and RepCol (repair column, the data specifying which column in the macro is to be repaired/replaced using the spare repair column). Upon exit from the power-down stage when microcode has become active, the microcode can restore the soft repair data into these banks of registers. Once the microcode completes writing a bank of registers, the microcode writes the "Microcode Restore Done" status bit to indicate to the fuse slave controller that it can act on the data just written. Once fuse slave controller completes the soft repair programming, it writes the "Fuse Ctl Load Done" status bit. Microcode can poll this bit periodically to be sure that soft repair programming has been completed. In one embodiment, the microcode can proceed with other restoration tasks before re-checking/polling this bit.

The microcode may also access a bank of soft repair data registers within a SRB Stop by using a pair of index and data SRB registers such as the registers 200, 205. In one embodiment, an index auto-post-increment method allows the microcode to access the bank in an efficient way. For example, the microcode may perform one write to the index register 200 and N writes/reads to the data register 205. The index register 200 may contain an index pointing to one of the registers in the bank. After that register is written/read, the index is auto-incremented to point to the next register in the bank. The index can be flexibly auto-incremented to start or stop at any index within the bank and in one embodiment microcode would write/read the whole bank of registers. This embodiment of the index/data access method can also help to save on the limited but precious SRB addressing space.

Figure 3:
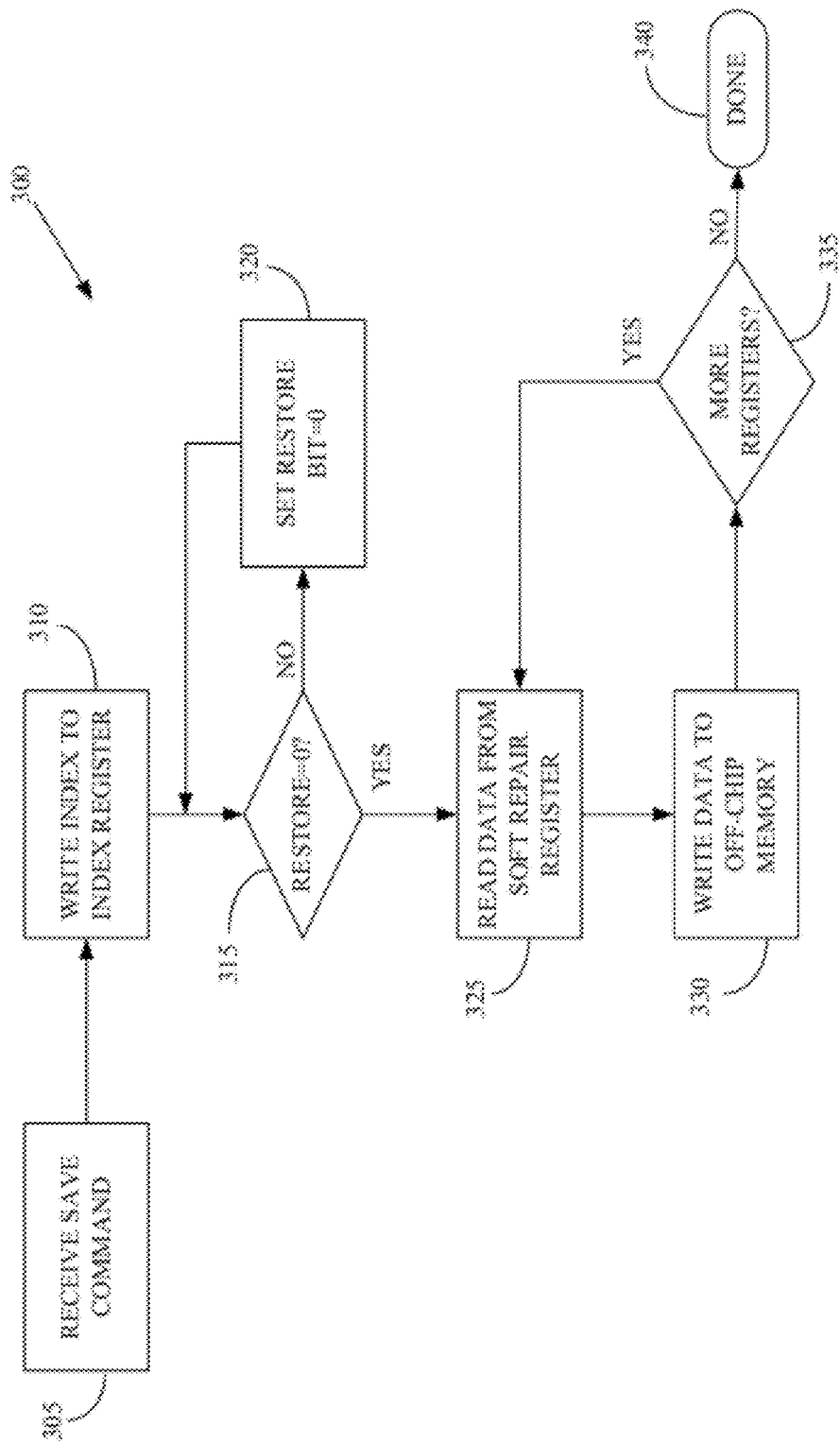
FIG. 3 conceptually illustrates one exemplary embodiment of a method of saving soft repair information in an off-chip memory.

FIG. 3 conceptually illustrates one exemplary embodiment of a method 300 of saving soft repair information in an off-chip memory. In the illustrated embodiment, the method 300 is implemented in microcode and begins when the microcode receives (at 305) a save command, e.g., in response to signaling indicating that a processor core including registers that store the soft repair information is going to enter a power-down state in which the VDD voltage supply is disconnected from the processor core. The microcode may then write (at 310) an index of one or more soft repair registers to an index register implemented in the processor core. For example, the microcode may write (at 310) to an SRB soft repair index register with either [1:0] or [3:0] being 2'b0 or 4'b0, respectively. Alternatively, the microcode may write (at 310) the intended starting index into the bank of registers. In one embodiment, the microcode may also verify (at 315) that the restore bit in the index register has been set to 0. If not, the restore bit can be set (at 320) to 0.

In the illustrated embodiment, the microcode reads (at 325) data and/or soft repair information from one or more soft repair registers. The soft repair information and/or data are then written (at 330) to off-chip memory so that the contents of the soft repair registers implemented in the processor core can be written (at 330) to corresponding registers and memory elements that are implemented off the processor core. For example, the microcode can read (at 325) a SRB Soft Repair Data register that returns the register data in the bank pointed by the lower bits of SRB Soft Repair Index register. The microcode then determines (at 335) whether more data, information, and/or registers need to be written to be off-chip memory. If so, the microcode continues to read (at 325) and write (at 330) the soft repair information and/or data until substantially all of the soft repair information have been written to the off-chip memory and the method completes (at 340).

Figure 4:
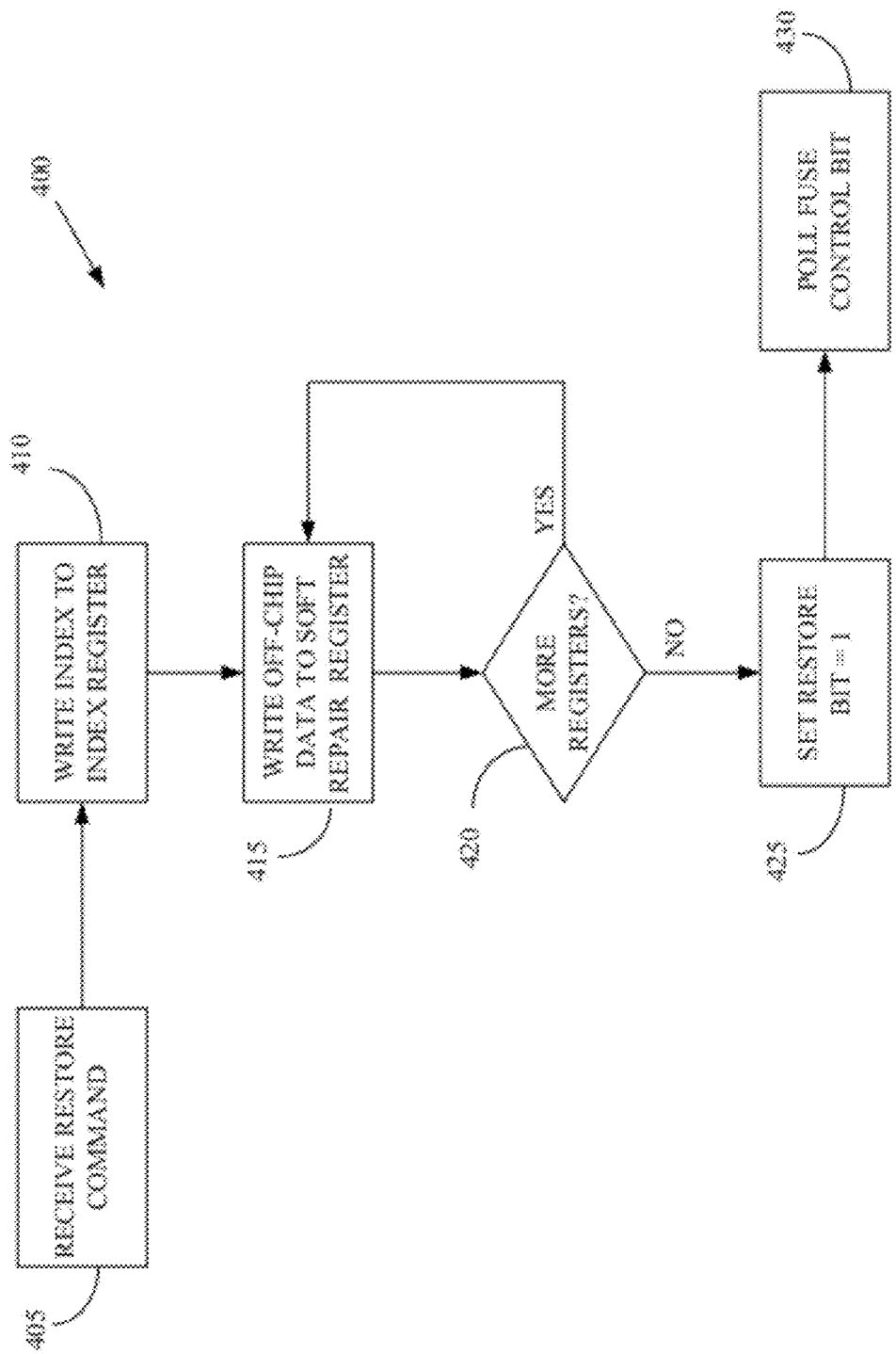
FIG. 4 conceptually illustrates one exemplary embodiment of a method of restoring soft repair information to registers in a processor core from an off-chip memory.

FIG. 4 conceptually illustrates one exemplary embodiment of a method 400 of restoring soft repair information to registers in a processor core from an off-chip memory. In the illustrated embodiment, the method 400 is implemented in microcode and begins after the microcode begins operating following exit from a power-down state of the power management cycle and receives (at 405) a restore command. The microcode writes (at 410) an index associated with the soft repair data and/or information to one or more soft repair registers implemented in the processor core. For example, the microcode may write (at 410) to an SRB soft repair index register with either [1:0] or [3:0] of the data being 2'b0 or 4'b0, respectively. Alternatively, the microcode may write (at 410) the intended starting index into the bank of registers.

The microcode may write (at 415) soft repair information and/or data from one or more off-chip memories or registers to one or more corresponding soft repair registers in the processor core. For example, the microcode may write (at 415) to a SRB soft repair data register with the actual soft repair data. This data may go to the register in the bank pointed to by the lower bits of SRB soft repair index register. The microcode may then determine (at 420) whether additional data, information, and/or registers remain to be written back into the soft repair registers in the processor core. The steps 410, 415, 420 may then be repeated or iterated until substantially all of the necessary soft repair data have been written (at 415) into registers in the processor core. The microcode may then set (at 425) a Restore Done bit to a value of 1. In one embodiment, the microcode may poll (at 430) a bit in the soft repair registers to determine if a fuse controller has completed loading a fuse control information for soft repairs. For example, the microcode may poll (at 430) on a Fuse Ctl Load Done bit in a SRB Soft Repair index register that is an acknowledgment from the fuse slave controller that the soft repair programming is completed. In various alternative embodiments, polling (at 430) may be performed periodically, after finishing other tasks, or in response to any other conditions or criteria.

Figure 5:
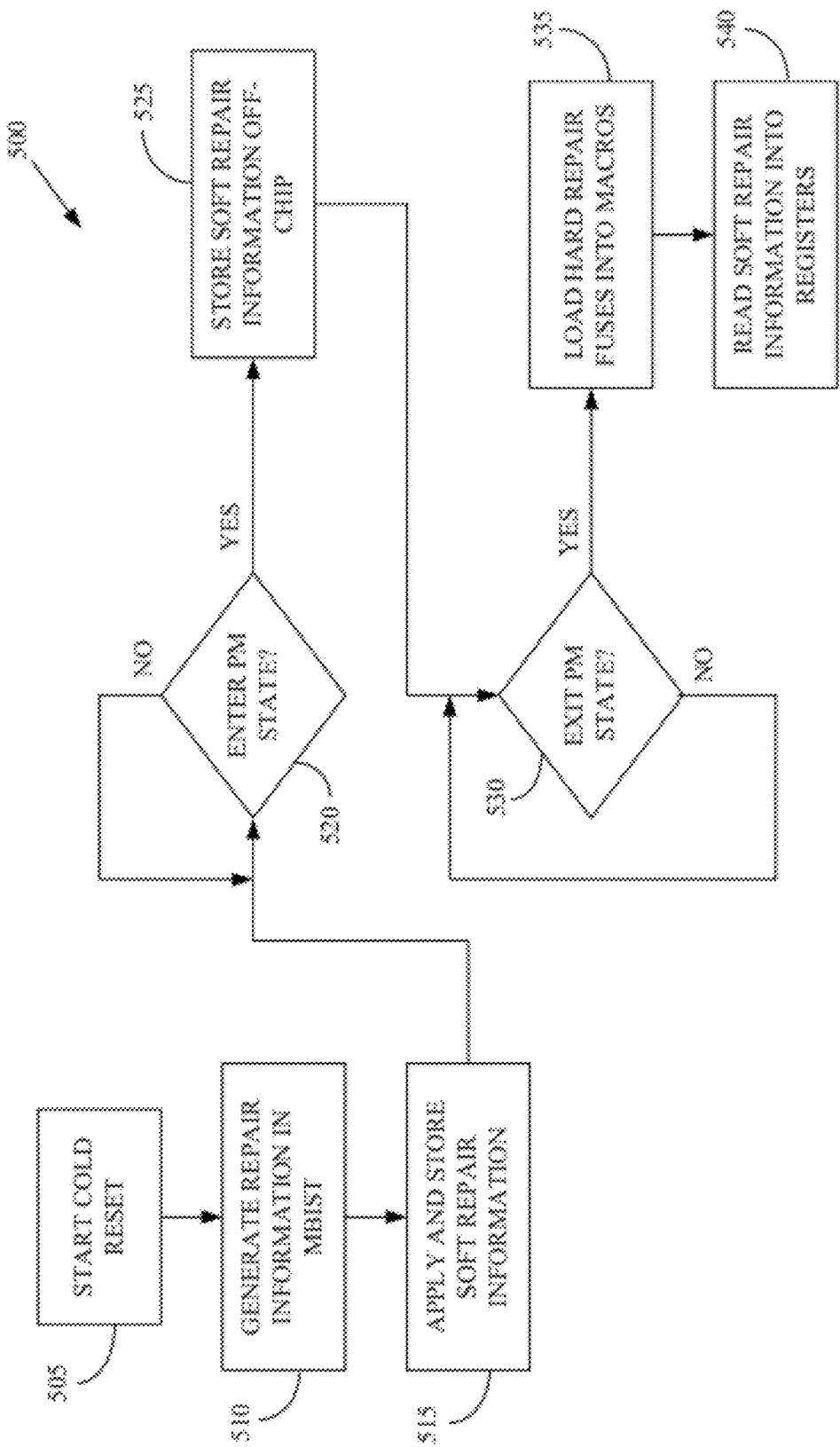
FIG. 5 conceptually illustrates one exemplary embodiment of a method for creating and managing soft repair information in a processor core.

FIG. 5 conceptually illustrates one exemplary embodiment of a method 500 for creating and managing soft repair information in a processor core. In the illustrated embodiment, a cold reset of the processor core is performed (at 505). Among other things, the cold reset may turn off power/voltage to the core and erase soft repair information stored in registers in the processor core. The processor core may then generate (at 510) repair information by performing a memory built-in self test (MBIST). The repair information may include hard repair information used to configure fuses and soft repair information that can be used by microcode to utilize redundant information, e.g., in cache arrays or macros in the processor core. The repair information can then be applied (at 515) to the cache arrays and/or macros and the soft repair information may be stored (at 515) in one or more soft repair registers in the processor core.

Microcode in the processor core may then determine (at 520) whether the processor core is going to enter a power management state, such as a power-down state in which voltage is disconnected from the processor core. As long as the processor core is operating normally, the microcode may simply wait and continue to monitor operation of the processor core. When the microcode determines (at 520) that the processor cores entering the power management state so that a VDD voltage may no longer be supplied to the processor core, the microcode may store (at 525) the on-chip soft repair information in an off-chip location, such as memories into registers located outside of the processor core.

The VDD voltage is restored to the processor core when it exits from the power-down state. The microcode in the processor core may then be into operate and may determine (at 530) that the processor core has exited the power-down state or is in the process of exiting the power-down state. The hard repair fuses may then be loaded (at 535) into the cache arrays and/or macros. The microcode may read (at 540) soft repair information from the off-chip location and into the on-chip soft repair registers implemented in the processor core. For example, the microcode may poll one or more bits to determine that the hard repair fuses have been loaded (at 535) into the cache arrays and/or macros. The microcode may then restore (at 540) the soft repair information that was saved off-chip and transmitted signal to a fuse controller to implement the soft repair is based upon the restored soft repair information.

Embodiments of this saving and restore mechanism can be performed without initiating an MBIST for the macros 115. Thus, there is no need to run MBIST during the power management cycle and the same soft repair information can be applied before and after a reset triggered by entry into to the power management cycle. Embodiments of the techniques described herein may therefore dramatically increase the exit latency of power management cycles implemented in the processor core 105, causing the power management state to be a lot less valuable in the overall power consumption envelope. The soft repair data happening after hard repair are stored and fully applied after a power management cycle exit, making the same repairs before a power-down state entry.

Embodiments of processor systems that can handle lane crossing instructions as described herein (such as the semiconductor device 100) can be fabricated in semiconductor fabrication facilities according to various processor designs. In one embodiment, a processor design can be represented as code stored on a computer readable media. Exemplary codes that may be used to define and/or represent the processor design may include HDL, Verilog, and the like. The code may be written by engineers, synthesized by other processing devices, and used to generate an intermediate representation of the processor design, e.g., netlists, GDSII data and the like. The intermediate representation can be stored on computer readable media and used to configure and control a manufacturing/fabrication process that is performed in a semiconductor fabrication facility. The semiconductor fabrication facility may include processing tools for performing deposition, photolithography, etching, polishing/planarizing, metrology, and other processes that are used to form transistors and other circuitry on semiconductor substrates. The processing tools can be configured and are operated using the intermediate representation, e.g., through the use of mask works generated from GDSII data.

Portions of the disclosed subject matter and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

Note also that the software implemented aspects of the disclosed subject matter are typically encoded on some form of program storage medium or implemented over some type of transmission medium. The program storage medium may be magnetic (e.g., a floppy disk or a hard drive) or optical (e.g., a compact disk read only memory, or "CD ROM"), and may be read only or random access. Similarly, the transmission medium may be twisted wire pairs, coaxial cable, optical fiber, or some other suitable transmission medium known to the art. The disclosed subject matter is not limited by these aspects of any given implementation.

The particular embodiments disclosed above are illustrative only, as the disclosed subject matter may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed:

1. A method, comprising:
    storing soft repair information for at least one cache array implemented in a processor core in a memory element outside of the processor core in response to determining that a voltage supply to the processor core is to be disconnected;
    wherein the voltage supply to the processor core is disconnected upon entry to a power management state of the processor core, and the method further comprising retrieving the soft repair information from the memory element outside of the processor core in response to the power management state ending and the voltage supply being restored to the processor core; and wherein retrieving the soft repair information comprises retrieving the soft repair information without performing a memory built-in self test.

2. The method of claim 1, comprising generating the soft repair information for said at least one cache array using a memory built-in self test performed following a cold reset of the processor core.

3. The method of claim 2, comprising storing the soft repair information generated by the memory built-in self test in at least one register implemented in the processor core.

4. The method of claim 3, wherein storing the soft repair information in the memory element outside of the processor core comprises writing the soft repair information from said at least one register implemented in the processor core to at least one off-core register implemented in the memory element outside of the processor core.

5. The method of claim 1, wherein retrieving the soft repair information comprises writing the soft repair information into at least one register implemented in the processor core.

6. The method of claim 5, comprising triggering repair of said at least one cache array using the soft repair information written into said at least one register implemented in the processor core.

7. An apparatus, comprising:

a processor core configured to store soft repair information for at least one cache array implemented in the processor core in a memory element outside of the processor core in response to determining that a voltage supply to the processor core is to be disconnected;

wherein the voltage supply to the processor core is disconnected upon entry to a power management state of the processor core, and wherein the processor core is configured to retrieve the soft repair information from the memory element outside of the processor core in response to the power management state ending and the voltage supply being restored to the processor core; and wherein the processor core is configured to retrieve the soft repair information without performing a memory built-in self test.

8. The apparatus of claim 7, comprising a memory built-in self test element configured to generate the soft repair information for said at least one cache array by performing a memory built-in self test following a cold reset of the processor core.

9. The apparatus of claim 8, comprising at least one register implemented in the processor core and configured to store the soft repair information generated by the memory built-in self test element.

10. The apparatus of claim 9, wherein the processor core is configured to write the soft repair information from said at least one register implemented in the processor core to at least one off-core register implemented in the memory element outside of the processor core.

11. The apparatus of claim 7, wherein the processor core is configured to write the soft repair information into at least one register implemented in the processor core.

12. The apparatus of claim 11, wherein the processor core is configured to trigger repair of said at least one cache array using the soft repair information written into said at least one register implemented in the processor core.

13. A computer system, comprising:

a processor core comprising at least one cache array; and a memory element implemented outside of the processor core, wherein the processor core is configured to store soft repair information for said at least one cache array in the memory element in response to determining that a voltage supply to the processor core is to be disconnected;

wherein the voltage supply to the processor core is disconnected upon entry to a power management state of the processor core, and wherein the processor core is configured to retrieve the soft repair information from the memory element outside of the processor core in response to the power management state ending and the voltage supply being restored to the processor core; and wherein the processor core is configured to trigger repair of said at least one cache array using the retrieved soft repair information without performing a memory built-in self test.

14. The computer system of claim 13, wherein the processor core comprises a memory built-in self test element configured to generate the soft repair information for said at least one cache array by performing a memory built-in self test following a cold reset of the processor core.

15. The computer system of claim 14, wherein the processor core comprises at least one register configured to store the soft repair information generated by the memory built-in self test element, and wherein the processor core is configured to write the soft repair information from said at least one register implemented in the processor core to at least one off-core register implemented in the memory element outside of the processor core.

* * * * *